United States Patent
Cho et al.

(10) Patent No.: US 11,872,516 B2
(45) Date of Patent: Jan. 16, 2024

(54) APPARATUS FOR TRAPPING OF REACTION BY-PRODUCT WITH EXTENDED AVAILABLE COLLECTION AREA

(71) Applicant: MILAEBO CO., LTD., Pyeongtaek-si (KR)

(72) Inventors: Che Hoo Cho, Seoul (KR); Yeon Ju Lee, Osan-si (KR); Jun Min Lee, Osan-si (KR); Ji Eun Han, Pyeongtaek-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 0 days.

(21) Appl. No.: 17/832,517

(22) Filed: Jun. 3, 2022

(65) Prior Publication Data
US 2023/0311051 A1 Oct. 5, 2023

(30) Foreign Application Priority Data
Mar. 29, 2022 (KR) .......... 10-2022-0038885

(51) Int. Cl.
| | |
|---|---|
| B01D 45/08 | (2006.01) |
| B01D 50/20 | (2022.01) |
| B01D 45/16 | (2006.01) |
| C23C 16/44 | (2006.01) |

(52) U.S. Cl.
CPC ............ *B01D 50/20* (2022.01); *B01D 45/08* (2013.01); *B01D 45/16* (2013.01); *C23C 16/4412* (2013.01)

(58) Field of Classification Search
CPC ........ B01D 50/20; B01D 45/08; B01D 45/16; C23C 16/4412
See application file for complete search history.

(56) References Cited

U.S. PATENT DOCUMENTS

| | | | | |
|---|---|---|---|---|
| 5,820,641 A * | 10/1998 | Gu | ....................... | B01D 5/0006 55/DIG. 15 |
| 6,156,107 A * | 12/2000 | Hayashi | ................. | B01D 45/08 438/905 |
| 11,054,174 B2 * | 7/2021 | Hwang | .................... | F24H 3/00 |
| 11,173,439 B2 * | 11/2021 | Cho | .................. | H01L 21/67017 |
| 11,623,175 B1 * | 4/2023 | Cho | .................. | H01J 37/32844 423/210 |

(Continued)

FOREIGN PATENT DOCUMENTS

| | | | |
|---|---|---|---|
| KR | 100862684 B1 | 10/2008 | |
| KR | 101447629 B1 | 10/2014 | |

(Continued)

*Primary Examiner* — Dung H Bui
(74) *Attorney, Agent, or Firm* — YOU & IP, LLC; Wansik You

(57) ABSTRACT

The present disclosure relates to an apparatus for trapping of a reaction by-product with an extended available collection area. The configuration of the present disclosure relates to an apparatus for trapping of a reaction by-product, which is configured to accommodate gas, which is discharged after a deposition process during a semiconductor manufacturing process, in a housing (1), heat the gas with a heater (2), trap a reaction by-product contained in the gas by using an internal trapping tower (3), and discharge only the gas.

9 Claims, 13 Drawing Sheets

(56) References Cited

U.S. PATENT DOCUMENTS

| | | | |
|---|---|---|---|
| 2007/0107595 A1* | 5/2007 | Na | B01D 53/68 95/288 |
| 2009/0107091 A1* | 4/2009 | Cho | C23C 16/4412 55/440 |
| 2009/0217634 A1* | 9/2009 | Choi | H01L 21/67017 55/428.1 |
| 2011/0252969 A1* | 10/2011 | Fischer | C23C 16/4412 55/434.2 |
| 2019/0194804 A1* | 6/2019 | Cho | H01L 21/67098 |
| 2020/0164296 A1* | 5/2020 | Cho | H01L 21/67017 |
| 2020/0217559 A1* | 7/2020 | Hwang | F24H 3/00 |
| 2020/0321226 A1* | 10/2020 | Cho | C23C 16/4412 |
| 2021/0039034 A1* | 2/2021 | Cho | B01D 45/08 |
| 2021/0053002 A1* | 2/2021 | Cho | B01D 45/06 |
| 2021/0134621 A1* | 5/2021 | Cho | C23C 16/4412 |
| 2021/0134701 A1* | 5/2021 | Cho | H01L 23/473 |
| 2022/0143543 A1* | 5/2022 | Maeng | B01D 50/20 |
| 2022/0228261 A1* | 7/2022 | Cho | C23C 16/4412 |
| 2022/0349052 A1* | 11/2022 | Cho | C23C 16/4401 |
| 2022/0349053 A1* | 11/2022 | Cho | H01J 37/32651 |
| 2022/0410047 A1* | 12/2022 | Cho | H01L 21/67069 |

FOREIGN PATENT DOCUMENTS

| | | | |
|---|---|---|---|
| KR | 101806480 B1 | | 1/2018 |
| KR | 102036273 B1 | | 10/2019 |
| KR | 102311939 B1 | * | 10/2021 |

* cited by examiner

APPARATUS FOR TRAPPING OF REACTION BY-PRODUCT WITH EXTENDED AVAILABLE COLLECTION AREA

CROSS-REFERENCE TO RELATED APPLICATIONS

This application claims the priority of Korean Patent Application No. 10-2022-0038885 filed on Mar. 29, 2022, in the Korean Intellectual Property Office, the disclosure of which is incorporated herein by reference.

BACKGROUND

Field

The present disclosure relates to an apparatus for trapping of a reaction by-product with an extended available collection area, and particularly, a trapping apparatus with a structure capable of trapping a reaction by-product included in gases discharged from a process chamber in a semiconductor manufacturing process with high efficiency inside and outside an internal trapping device and a structure capable of preventing external leak of a trapped porous powder reaction by-product.

Description of the Related Art

In general, a semiconductor manufacturing process is broadly divided into a front-end process (fabrication process) and a back-end process (assembly process). The front-end process refers to a process of manufacturing semiconductor chips by processing specific patterns by repeatedly performing a procedure of depositing thin films on wafers in various types of process chambers and a procedure of selectively etching the deposited thin films. The back-end process refers to a process of individually separating the chips manufactured in the front-end process and then assembling finished products by combining the chips and lead frames.

In this case, the process of depositing the thin film on the wafer or etching the thin film deposited on the wafer is performed at a high temperature by injecting necessary process gases such as a precursor gas for depositing the thin film and etching gases into a process chamber through a gas injection system. In this case, various types of reaction by-products, which are not used for deposition, unreacted ignitable gases, and harmful gases containing corrosive foreign materials and toxic materials are produced in large amounts in the process chamber, and the resultant products are discharged as exhaust gases.

For this reason, in a semiconductor manufacturing facility, an apparatus for trapping of a reaction by-product traps a particulate reaction by-product contained in exhaust gas discharged from the process chamber and a scrubber positioned in an exhaust line of the rear end of a vacuum pump that makes the process chamber in a vacuum state finally purifies non-reacted gas again and then discharges the gas into the atmosphere.

Meanwhile, when the apparatus for trapping of a reaction by-product traps the reaction by-product in an internal trapping tower for a use duration time, the reaction by-products are mainly attached or accumulated between a housing and an outer side of a trapping plate of the internal trapping tower, which causes rapid deterioration in trapping efficiency.

When the reaction by-product trapping efficiency of the trapping apparatus deteriorates as described above, the apparatus for trapping of a reaction by-product is replaced with a new apparatus or a trapping apparatus regenerated by cleaning the interior of the internal trapping tower and the interior of the housing of the apparatus for trapping of a reaction by-product to smoothly perform the semiconductor manufacturing process.

There is a region in which additional trapping is enabled in the internal trapping tower even though the trapping efficiency of the trapping apparatus deteriorates as described above. However, such an available collection area cannot be sufficiently utilized, and the trapping apparatus is replaced. For this reason, there is a disadvantage in that the use duration time may be shortened, and the semiconductor manufacturing cost may increase.

As a prior art that has solved the above problems, there is disclosed Korean Patent Registration No. 10-2036273 (semiconductor process by-product trapping device), which is a previously registered patent of the present applicant.

In the technology, a plurality of horizontal and vertical plates, which has an isosceles trapezoidal shape and has a plurality of vertical gas through holes perforated only in a portion exposed to the outside when coupled to each other, is assembled in a lattice form to have a pyramidal shape with four inclined slopes. However, the horizontal and vertical plates maintain the lattice form crossed in a 90° direction by connecting pieces left only at the bottom part for mutual coupling, and an exhaust gas passage space portion is formed in a penetrated form in the upper center. A by-product trapping tower is installed between a second upper horizontal bracket and a lower horizontal bracket, in which the exhaust gas introduced through the second upper horizontal bracket passes through the exhaust gas passage space portion, the remaining exhaust gas flows along the plurality of horizontal and vertical plates having the isosceles trapezoidal shape, and a part of the by-product is trapped in a powder form. By providing such a configuration, it was possible to trap the reaction by-product even through the inner region as well as the outer region of the trapping tower.

However, in the prior art of the present applicant, since the inner region space of the trapping tower has a structure in which the upper and lower widths are the same, the upper portion tends to be clogged first as the reaction by-product is trapped, and thus there is a disadvantage that the lower portion of the inner region may not be fully utilized. That is, since the shape of the inner cutouts of the horizontal and vertical plates has a vertical shape, the width of the upper space portion and the width of the lower space portion have the same shape, so that the inner region as a whole has a spatial structure like a quadrangular cylindrical body. However, in the case of such a configuration, there is a structural disadvantage that in the gas introduced from the upper portion, as the trapping reaction occurs first at the upper portion, the width is gradually narrowed, so that the amount of the gas moving to the lower portion may be reduced.

In addition, there is a structural disadvantage that the effect of vortex generation is small in the space between the outer side of the trapping tower and the housing by a plurality of vertical gas through holes formed in the surface formed by lattice-coupling the horizontal and vertical plates to have an isosceles trapezoidal shape, so that the trapping efficiency is not large, on the contrary, due to the plurality of vertical gas through holes, the flow of the gas flowing downward to the inner space of the trapping apparatus is delayed, so that the reaction by-product is first trapped from the upper portion before flowing into the lower space mentioned above and the trapping efficiency in the lower space may further deteriorate.

In addition, the apparatus for trapping of a reaction by-product of the present applicant has a structural disadvantage that due to the plurality of vertical gas through holes, the reaction by-product trapping region on the surfaces of the horizontal and vertical plates is reduced, so that the total trapping amount of the reaction by-product may be reduced in the outer region of the trapping apparatus.

In addition, there is a structural problem that since the apparatus for trapping of a reaction by-product of the present applicant has no suitable storage structure to store the reaction by-product trapped during the use duration time by the trapping tower, according to the flow of the gas with the rapid increase in the amount of gas due to the development of the deposition process, the formation of porous powder may increase, and the reaction by-product may be discharged through the gas discharge port of the housing as the powder is blown. That is, there is a problem that the particulate reaction by-product in the trapped powder state is leaked to the outside through the exhaust line to cause the failure of the scrubber.

In addition, it is disclosed that the apparatus for trapping of a reaction by-product of the present applicant has a window structure which blocks a by-product passing through the by-product trapping tower and the lower horizontal bracket or introduced in a lateral direction through the inner space of the housing and changed to a powder form from being directly introduced to the gas trapping discharge port and guides only the exhaust gas to the gas trapping discharge port side. However, there is a structural problem that only with the window structure formed in such a single structure, it may not be sufficiently effective to block the reaction by-product in the particulate powder state contained in the gas from being leaked to the external exhaust line through the gas discharge port of the housing.

Accordingly, there is a need for a technology capable of sufficiently utilizing the available collection area in the trapping apparatus and increasing the use duration time of the trapping apparatus, but this technology has not been provided up to now.

DOCUMENTS OF RELATED ART

Patent Documents (Patent Document 1) Korean Patent No. 10-2036273 (registered on Oct. 18, 2019)
(Patent Document 2) Korean Patent No. 10-0862684 (registered on Oct. 2, 2008)
(Patent Document 3) Korean Patent No. 10-1447629 (registered on Sep. 29, 2014)
(Patent Document 4) Korean Patent No. 10-1806480 (registered on Dec. 1, 2017)

SUMMARY

An object to be achieved by the present disclosure is to provide an apparatus for trapping of a reaction by-product, in which an internal trapping device of the apparatus for trapping of a reaction by-product, which traps a reaction by-product contained in gas discharged from a process chamber during a semiconductor manufacturing process, extends an available collection area so as to be uniformly trapped in an inner region and an outer region while the gas flow is changed and guided according to a trapping amount during former and latter parts of a use duration time by arranging a plurality of planar cross-shaped vertical plates to be spaced apart from each other at predetermined intervals along a periphery direction. Accordingly, the inner region structure is formed to be a collection space structure which has a reversed trapezoidal shape having a small lower portion and a large upper portion to prevent blockage of the upper part when trapping the reaction by-product, thereby increasing the available collection space and a trapping cover is formed to trap a powder-shaped reaction by-product trapped in the inner and outer regions of the intermediate trapping unit of the internal trapping device formed in multiple stages, thereby preventing the reaction by-product from being leaked to the outside.

Another object to be achieved by the present disclosure is to provide an apparatus for trapping of a reaction by-product, in which the gas flows downward rapidly without a load while being guided along the plane surface of a planar cross-shaped vertical plates to be accumulated in an inner region space after a trapping reaction occurs in an inner side surface of the planar cross-shaped vertical plates at a former part of a use duration time, and the gas flows to the outer region from an upper side of the inner region of the planar cross-shaped vertical plates at a latter part of the use duration time, and then flows downward along the outer side surface so that an additional trapping reaction occurs, thereby enabling the trapping reaction to occur by extending the available collection area.

Still another object to be achieved by the present disclosure is to provide an apparatus for trapping of a reaction by-product, in which vortex plates installed along an outer lower periphery of the intermediate trapping unit of the internal trapping tower formed in multiple stages are provided to generate a vortex while reducing the flow velocity of the gas flowing downward during the use duration time and induce the formation of a reaction by-product in the form of lumps while increasing the trapping reaction time, so that the generated reaction by-product is accumulated or dropped and accumulated on the trapping cover installed below to prevent the leak to the outside.

An aspect of the present disclosure to achieve the objects and remove the drawbacks of the prior arts provides an apparatus for trapping of a reaction by-product, which is configured to accommodate gas, which is discharged after a deposition process during a semiconductor manufacturing process, in a housing, heat the gas with a heater, trap a reaction by-product contained in the gas by using an internal trapping tower, and discharge only the gas.

The internal trapping tower may be configured to trap, in multiple stages, the reaction by-product according to a height, the internal trapping tower including separately: an upper end trapping unit configured to perform a trapping reaction while guiding and lowering a main flow of the gas to a central portion; an intermediate trapping unit in which an inner region is formed as a reversed trapezoidal space portion so as to accommodate the introduced gas and trap the reaction by-product; a lower end trapping unit configured to prevent a leak of the trapped reaction by-product to a gas discharge port of the housing while trapping, in multiple stages, the reaction by-product from the gas introduced through a lateral side; and a trapping cover 34 configured to prevent an external leak by trapping the reaction by-product in a porous powder form trapped in the inner and outer regions of the intermediate trapping unit.

The intermediate trapping unit may be configured such that depending on a change in trapping amount according to an elapse of a use duration time, a main flow of the gas is guided so that the gas flows toward an outer region after flowing downward to an inner region of planar cross-shaped vertical plates forming a periphery during a former part of the use duration time, and the gas is guided to flow downward after flowing to the outer region of the planar cross-shaped vertical plates from an upper side of the inner region during a latter part of the use duration time when the trapped reaction by-product is accumulated in the inner region, such that an additional trapping reaction is performed.

In the exemplary embodiment, the upper end trapping unit may be configured to guide the gas, which is distributed in a direction from the heater toward an outer periphery in the housing and flow downward, to the intermediate trapping unit through a main gas hole formed in a central portion and relatively small auxiliary gas holes circularly arranged around the main gas hole and trap the reaction by-product contained in the gas on an upper surface installed with double cross-shaped plates and a lower surface installed with quadrangular plates.

In the exemplary embodiment, the intermediate trapping unit may include a plurality of planar cross-shaped vertical plates coupled to a lower portion spaced apart from the upper end trapping unit at a predetermined interval and disposed to have gaps at predetermined intervals and defining a periphery, and an individual vertical plate constituting the planar cross-shaped vertical plates may be formed in a trapezoidal shape in which an area of the vertical plate facing inward is increased from the top to the bottom and configured to provide a trapping space in which an upper space in the inner region is larger than a lower space in the inner region of the intermediate trapping unit.

In the exemplary embodiment, the apparatus for trapping of a reaction by-product may further include vortex plates installed along the periphery of the intermediate trapping unit, and formed with one or more gas slits formed outside in a longitudinal direction and gas openings formed inside.

In the exemplary embodiment, the vortex plate may be inclined so that an outer side thereof is high.

In the exemplary embodiment, the trapping cover may have a cylindrical structure in which a plurality of gas holes is arranged on a surface, and may be spaced apart from the lower portion of the intermediate trapping unit at a predetermined interval to be installed in a vertical direction on the lower end trapping unit along the periphery.

In the exemplary embodiment, the trapping cover may be installed so that the vortex plate having an inclined shape covers the upper portion.

In the exemplary embodiment, the lower end trapping unit may be connected to the lower portion of the intermediate trapping unit and includes an outer periphery trapping plate part and an inner trapping plate part (332) which have a plurality of gas holes formed in surfaces thereof and are disposed in multiple stages, in which the lower end trapping unit may prevent the gas, which is subjected to the trapping reaction in the inner region and the outer region of the intermediate trapping unit, from flowing downward directly into the gas discharge port provided on a lower plate of the housing and the gas is guided toward the inner side from the outer periphery, such that the trapping reaction is finally performed, and then the gas may flow into the upper side of the gas discharge port protruding upward from the central portion of the lower plate of the housing and then flow downward.

In the exemplary embodiment, the outer peripheral trapping plate part may have a structure opened at a lower side thereof and includes an upper trapping plate and lateral trapping plates each having a plurality of gas holes, in which each lateral trapping plate may consist of a blocking part in which gas holes are not formed in an upper predetermined region to block the flow of the gas, thereby preventing the reaction by-product, which has fallen through the upper trapping plates from the intermediate trapping unit, from being leaked in the lateral direction.

In the exemplary embodiment, the inner trapping plate part may have a structure opened at a lower side thereof, in which the upper trapping plate may be formed in a blocked structure and installed to be spaced apart from the upper trapping plate of the outer periphery trapping plate part at a predetermined interval by spacers, and each lateral trapping plate may be formed with a plurality of gas holes.

According to the apparatus for trapping of a reaction by-product with the extended available collection area according to the present disclosure having the above-mentioned features, an internal trapping device of the apparatus for trapping of a reaction by-product, which traps a reaction by-product contained in gas discharged from a process chamber during a semiconductor manufacturing process, extends an available collection area so as to be uniformly trapped in an inner region and an outer region while the gas flow is changed and guided according to a trapping amount during former and latter parts of a use duration time by arranging a plurality of planar cross-shaped vertical plates to be spaced apart from each other at predetermined intervals along a periphery direction.

In addition, according to the present disclosure, by configuring the upper end trapping unit, the intermediate trapping unit, and the lower end trapping unit in multiple stages, the trapping reaction occurs in multiple stages. The structure of the intermediate trapping unit is configured so that the plurality of planar cross-shaped vertical plates is quadrangular-arranged at predetermined intervals along the periphery direction, so that the flow of the introduced gas flows downward rapidly along the surfaces of the planar cross-shaped vertical plates without a load and the trapping reaction occurs uniformly from the upper region to the lower region. During the former part of the use duration time, the trapping reaction evenly occurs in the inner region of the planar cross-shaped vertical plates, so that the reaction by-product is accumulated using the entire inner region space. During the latter part of the use duration time, while the gas flows downward along the outer surfaces of the planar cross-shaped vertical plates, an additional trapping reaction occurs. Therefore, the available collection area is extended.

In addition, according to the present disclosure, the structure of the inner region of the internal trapping device has a reversed trapezoidal trapping space structure with a narrow lower portion and a wide upper portion to prevent the blockage of the upper portion when the reaction by-product is trapped, thereby increasing an available collection space.

In addition, according to the present disclosure, the reaction by-product, which is trapped in the inner region and the outer region of the intermediate trapping unit constituting the internal trapping tower of the apparatus for trapping of a reaction by-product, is accumulated and stored in the trapping cover and the remaining gas passes through the lower end trapping unit formed in the multiple stages while the trapping reaction occurs again to be discharged to the gas discharge port, thereby preventing the leak of the reaction by-product in multiple stages.

In addition, according to the present disclosure, the vortex plates installed along an outer lower periphery of the intermediate trapping unit of the internal trapping tower formed in multiple stages are provided to generate a vortex while reducing the flow velocity of the gas flowing downward during the use duration time and induce the formation of a reaction by-product in the form of lumps while increasing the trapping reaction time, so that the generated reaction by-product is accumulated or dropped and accumulated on the trapping cover installed below, thereby preventing the leak to the outside.

The present disclosure is a useful invention having many advantages as described above and is an invention that is highly expected to be used in industries.

BRIEF DESCRIPTION OF THE DRAWINGS

The above and other aspects, features, and other advantages of the present disclosure will be more clearly understood from the following detailed description taken in conjunction with the accompanying drawings, in which.

DETAILED DESCRIPTION OF THE EMBODIMENT

Hereinafter, configurations and operations of embodiments of the present disclosure will be described in detail with reference to the accompanying drawings. In addition, in the description of the present disclosure, the specific descriptions of related well-known functions or configurations will be omitted when it is determined that the specific descriptions may unnecessarily obscure the subject matter of the present disclosure.

Figure 1:
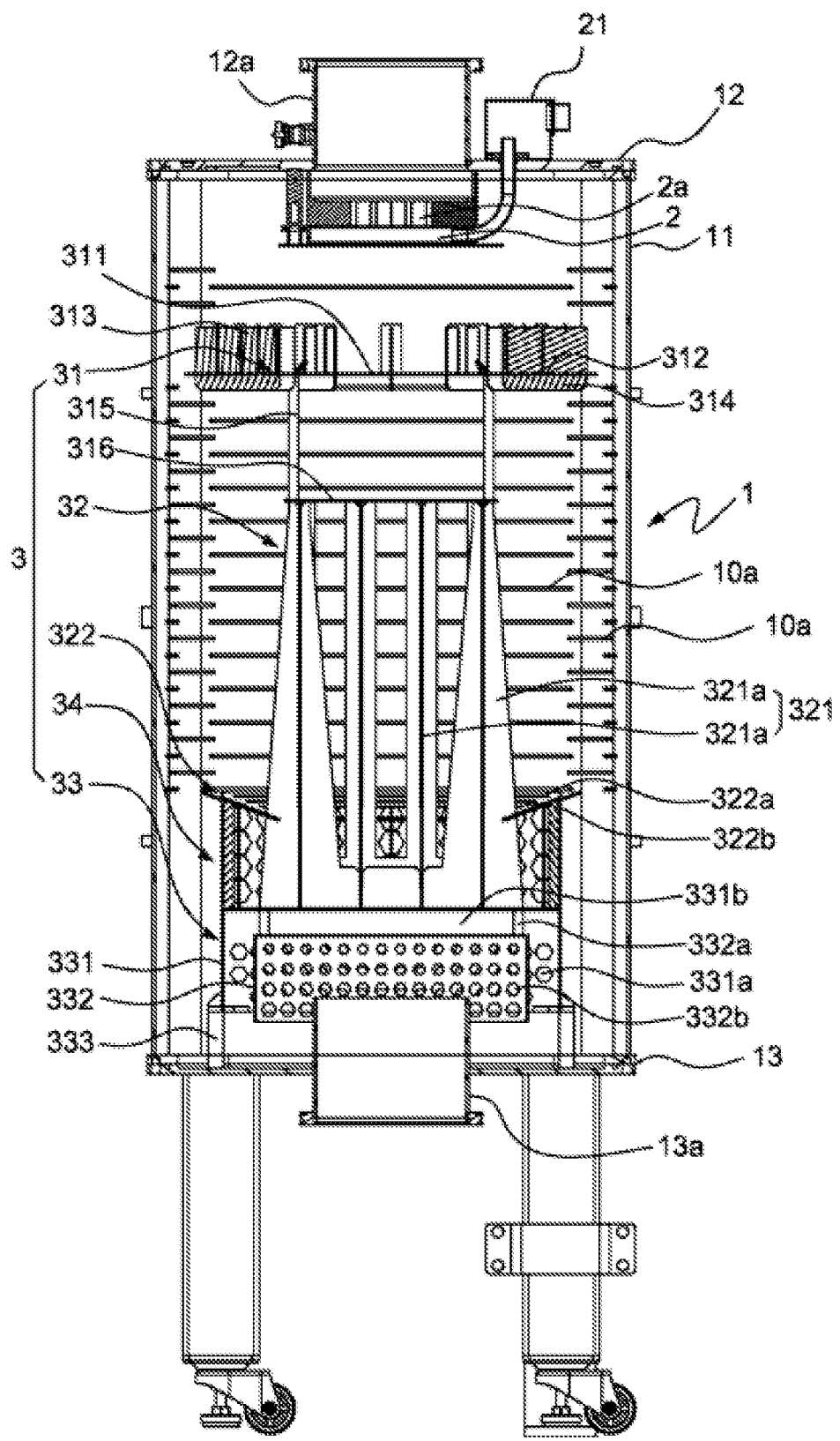
FIG. 1 is a cross-sectional view illustrating an internal configuration of an apparatus for trapping of a reaction by-product according to an embodiment of the present disclosure.
Figure 2:
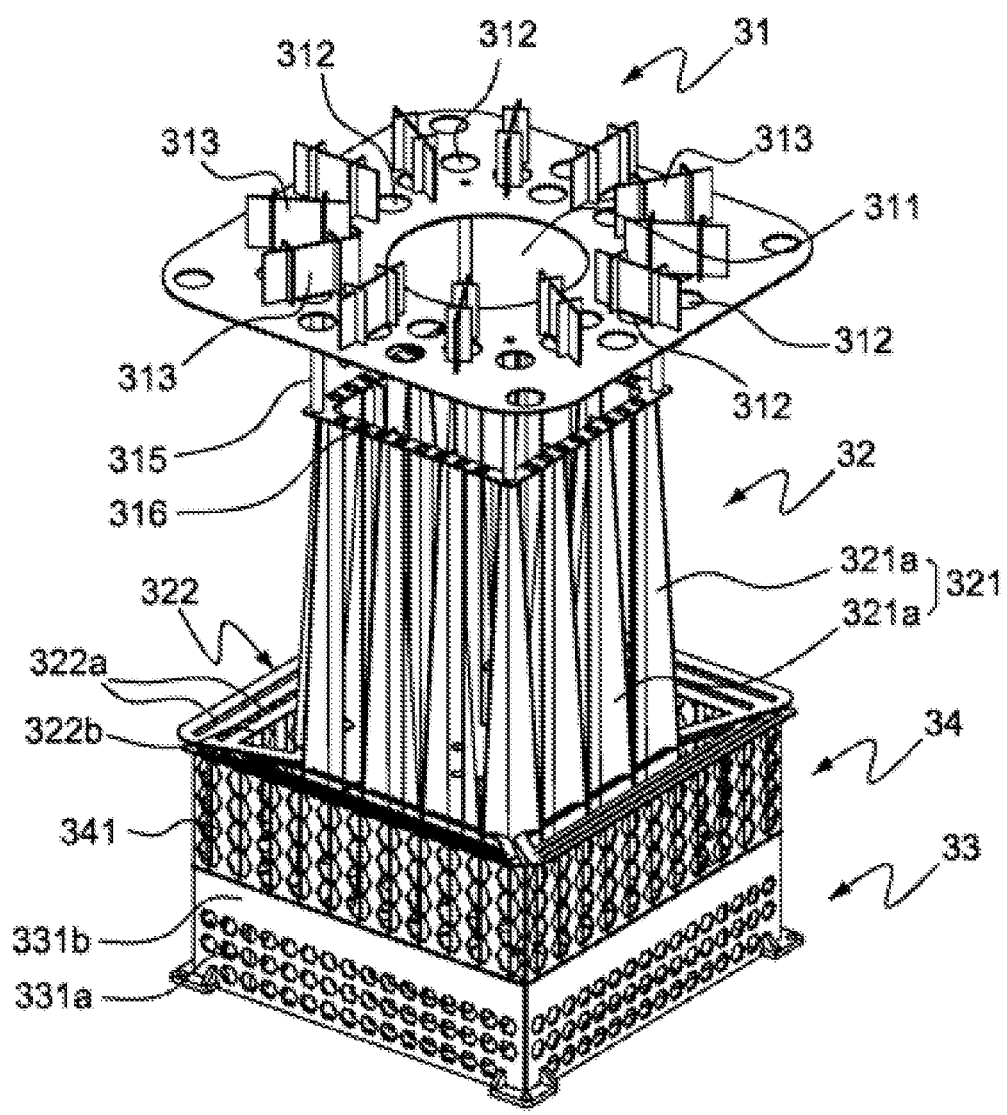
FIG. 2 is a perspective view of an internal trapping tower according to the embodiment of the present disclosure.
Figure 3:
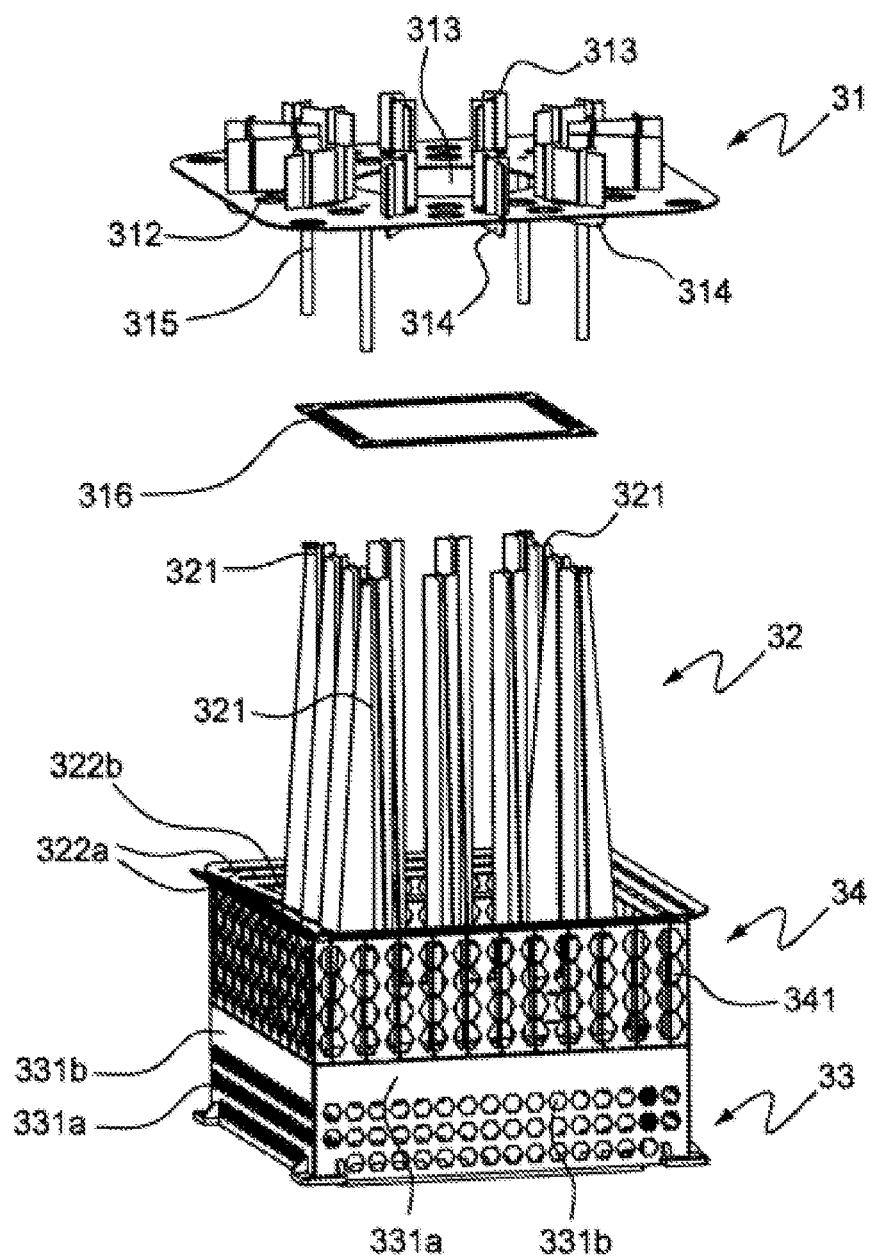
FIG. 3 is a partially exploded perspective view of the internal trapping tower according to the embodiment of the present disclosure.
Figure 4:
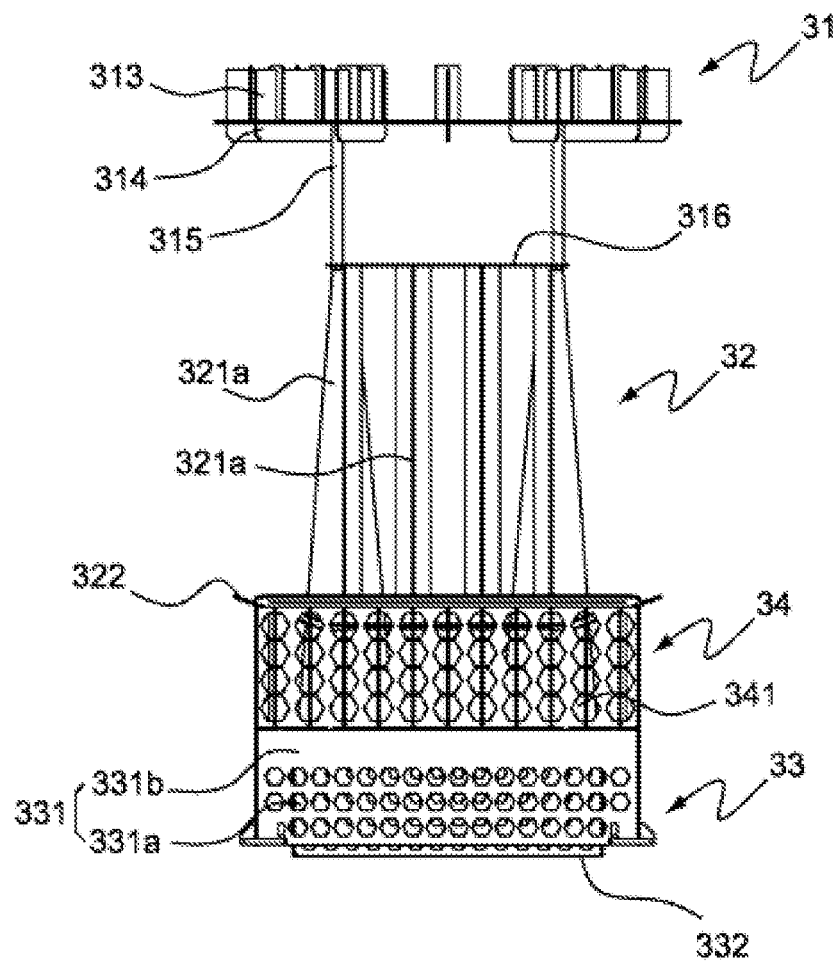
FIG. 4 is a front view illustrating an entire assembled structure of the internal trapping tower according to the embodiment of the present disclosure.
Figure 5:
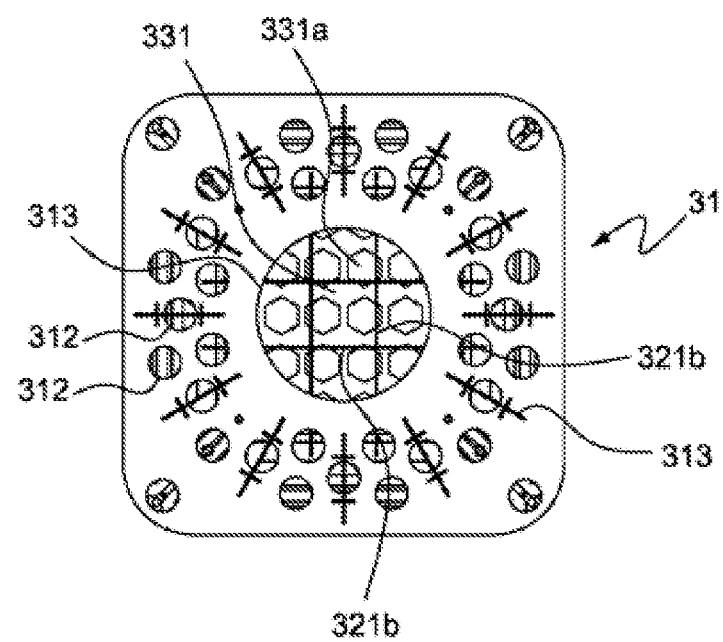
FIG. 5 is a top plan view of the internal trapping tower according to the embodiment of the present disclosure.
Figure 6:
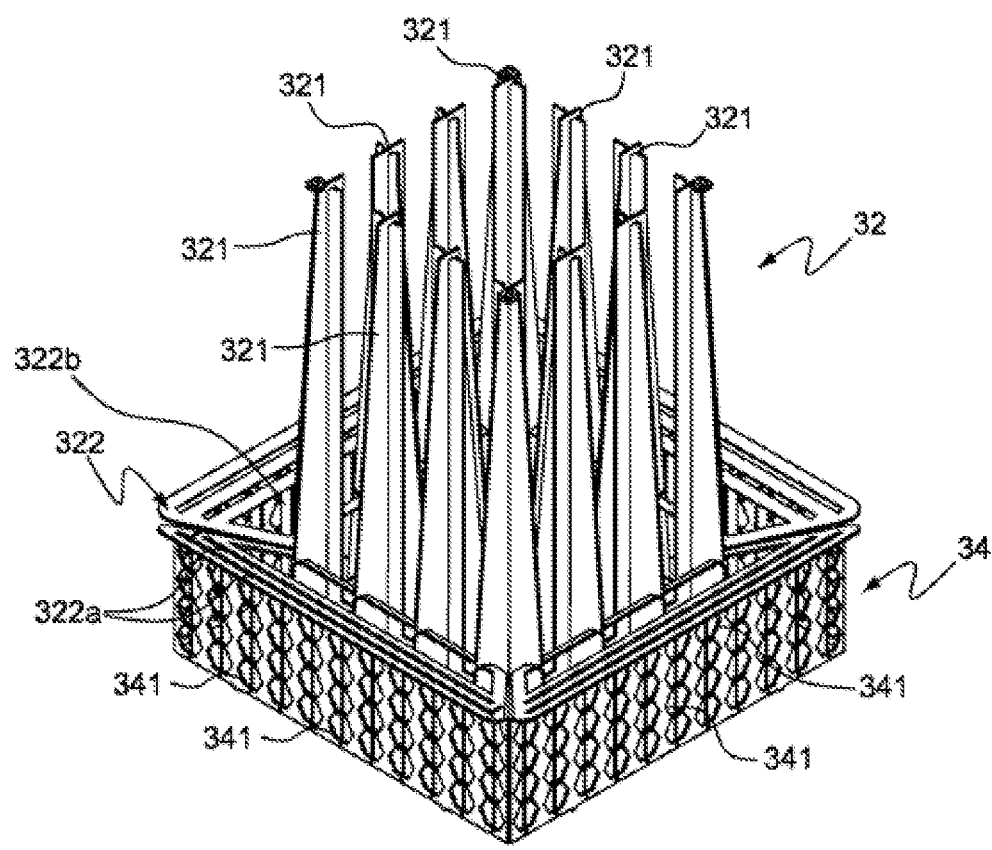
FIG. 6 is a perspective view of an intermediate trapping unit according to the embodiment of the present disclosure.
Figure 7:
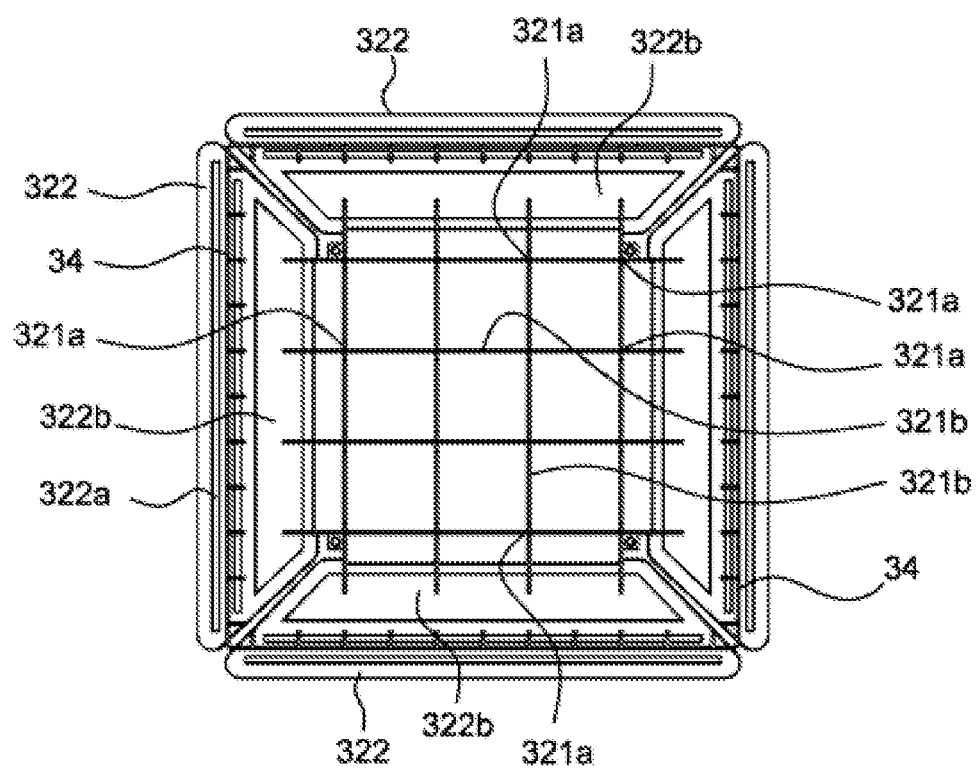
FIG. 7 is a bottom plan view of the intermediate trapping unit according to the embodiment of the present disclosure.
Figure 8:
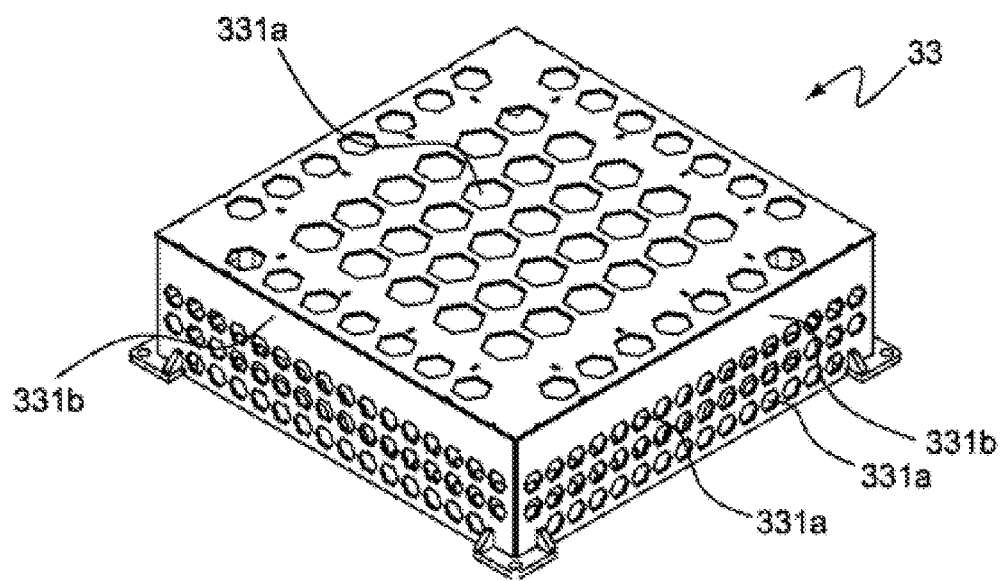
FIG. 8 is a perspective view of a lower end trapping unit according to the embodiment of the present disclosure.
Figure 9:
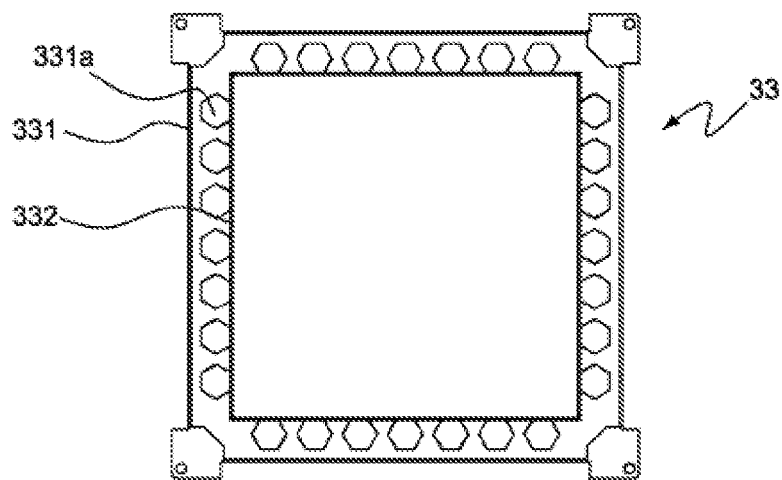
FIG. 9 is a bottom plan view of the lower end trapping unit according to the embodiment of the present disclosure.

FIG. 1 is a cross-sectional view illustrating an internal configuration of an apparatus for trapping of a reaction by-product according to an embodiment of the present disclosure, FIG. 2 is a perspective view of an internal trapping tower according to the embodiment of the present disclosure, FIG. 3 is a partially exploded perspective view of the internal trapping tower according to the embodiment of the present disclosure, FIG. 4 is a front view illustrating an entire assembled structure of the internal trapping tower according to the embodiment of the present disclosure, FIG. 5 is a top plan view of the internal trapping tower according to the embodiment of the present disclosure, FIG. 6 is a perspective view of an intermediate trapping unit according to the embodiment of the present disclosure, FIG. 7 is a bottom plan view of the intermediate trapping unit according to the embodiment of the present disclosure, FIG. 8 is a perspective view of a lower end trapping unit according to the embodiment of the present disclosure, and FIG. 9 is a bottom plan view of the lower end trapping unit according to the embodiment of the present disclosure.

As illustrated, an apparatus for trapping of a reaction by-product with an extended available collection area according to the present disclosure refers to an apparatus that traps and removes a particulate reaction by-product, which is contained in the gas discharged after performing a deposition process in a process chamber (not illustrated) of a semiconductor manufacturing process, and then discharges only the remaining gas to a rear end exhaust line of the apparatus for trapping of a reaction by-product.

A configuration of the apparatus for trapping of a reaction by-product includes: a housing 1 configured to accommodate gas, which is discharged after a deposition process during a semiconductor manufacturing process, and discharge the gas; a heater 2 configured to heat the gas accommodated in the housing; and an internal trapping tower 3 configured to trap, in multiple stages, the reaction by-product from the gas introduced into the housing and prevent a leak according to height, the internal trapping tower 3 separately including: an upper end trapping unit 31 configured to perform a trapping reaction while guiding a main flow of gas to a central portion and flowing downward; an intermediate trapping unit 32 having a structure having an inner region formed as a reversed trapezoidal space so as to accommodate the introduced gas and trap the reaction by-product; and a lower end trapping unit 33 configured to prevent a leak of the trapped reaction by-product while trapping, in multiple stages, the reaction by-product from the gas introduced through a lateral side, and a trapping cover 34 configured to trap a reaction by-product in the form of porous powder trapped in the inner and outer regions of the intermediate trapping unit to prevent a leak to the outside.

As an embodiment, the deposition process may be a deposition process in which a process gas is introduced into a process chamber for manufacturing NAND FLASH. However, the present disclosure is not a trapping apparatus limited only to the deposition process for manufacturing the NAND FLASH, but may be applied to a process of trapping a reaction by-product contained in various gases discharged after supplying the gas to the process chamber during various semiconductor manufacturing processes.

Hereinafter, the respective components will be described in more detail.

The housing 1 is configured vertically to introduce and accommodate the gas discharged from the process chamber during the semiconductor manufacturing process to discharge the gas into an upper portion of the housing 1. Specifically, the housing 1 includes a housing main body 11 configured to accommodate the introduced gas, an upper plate 12 having a gas inlet port 12$a$ protruding upward, and a lower plate 13 having a gas discharge port 13$a$ protruding in two upward and downward directions.

In addition, like the embodiment illustrated as necessary, the housing may further include support legs and driving rollers provided on a lower portion of the lower plate for moving.

The shape of the housing main body 11 according to the embodiment of the present disclosure is illustrated as having a quadrangular column shape according to a shape of the internal trapping tower. However, the present disclosure is not limited only to the above-mentioned shape, and the housing main body 11 may of course have a necessary shape such as a cylindrical shape and a polygonal column shape.

The housing main body 11 has a plurality of wall surface plates 10$a$ installed in a horizontal direction for each inner wall and arranged at predetermined intervals in a vertical direction. The wall surface plates 10$a$ trap the reaction by-product while increasing the time for which the gas remains in an internal space of the housing by generating vortices of the gas passing through the interior of the housing 1.

A cross-sectional shape of the wall surface plate 10$a$ is formed to have a flat plate shape having a horizontal shape according to one embodiment. However, in addition to the above-mentioned shape, the wall surface plate 10$a$ may have an inclined surface made by bending an inner end of the wall surface plate 10$a$ upward or downward, or may be rounded. The wall surface plate having the above-mentioned shape acts as a load against a downward flow of the gas and generates the vortex made by differences in relative directions and velocities from gas flowing adjacent thereto. Therefore, the wall surface plate traps the reaction by-product by increasing the trapping reaction time while increasing the time for which the gas remains in the internal space of the housing.

The gas discharge port 13$a$ may protrude upward from the lower plate 13 to allow the reaction by-product accumulated in the lower plate or the gas passing through the lower end trapping unit to be discharged after ascending without being introduced directly to the interior of the gas discharge port, thereby preventing the trapped reaction by-product from being leaked together with the gas.

The heater 2 is installed on a lower surface of the upper plate 12 which is an upper side of the housing main body 11 to heat the gas introduced through the gas inlet port 12$a$ and form a part of a temperature zone not to be trapped at an upper end of the housing and to prevent a situation in which the by-product is accumulated in the upper end of the housing and the gas inlet port 12$a$ to be clogged at initial using time.

As a means for uniformly distributing the heated gas into the internal space of the housing main body 11 so that the trapping reaction smoothly occurs, diffusers 2$a$ are radially provided above the heater to uniformly distribute the heated gas.

In addition, a heater power supply unit 21 is installed on the upper plate 12 of the housing to supply power to the heater 2 and measure a temperature for controlling a power supply source on the basis of an internal temperature of the housing.

The internal trapping tower 3 has a structure in which the trapping regions are divided into the upper end trapping unit 31, the intermediate trapping unit 32, the lower end trapping unit 33, and the trapping cover 34 that traps the porous powder-shaped reaction by-product trapped in the inner and outer regions of the intermediate trapping unit according to the height to prevent a leak to the outside to trap the gas introduced into the housing in the multiple stages.

Particularly, the intermediate trapping unit 32 of the internal trapping tower 3 is configured to trap the reaction by-product while the main flow of the gas flows downward to the reversed trapezoidal space portion which is the inner region of the planar cross-shaped vertical plates 321 forming the periphery during a former part of the use duration time depending on a change in trapping amount according to an elapse of a use duration time to guide the gas to flow to the outer region of the capturing cover 34. In addition, the intermediate trapping unit 32 is configured to guide the gas to flow downward after flowing to the outer region of the planar cross-shaped vertical plates 321 from the upper side of the inner region in which the reaction by-product is accumulated during a latter part of the use duration time to perform an additional trapping reaction, thereby maximizing the entire trapping efficiency by extending the available collection area.

In addition, the trapping cover 34 is provided to serve as a kind of filter that allows the gas to pass while blocking the reaction by-product in the form of porous powder from moving according to the gas flow to first block the gas to be discharged through the gas discharge port.

The lower end trapping unit 33 that finally traps the reaction by-product while filtering the gas passing through the capturing cover 34 serves to second block the gas, so that the trapping cover 34 traps a large amount of reaction by-products to enable a more precise filtering effect.

Hereinafter, respective configurations of the internal trapping tower 3 will be described in detail.

The upper end trapping unit 31 guides the gas, which is distributed in a direction from the heater toward an outer periphery in the housing and flows downward, to the intermediate trapping unit 32 spaced apart from the lower portion at a predetermined interval through a main gas hole 311 formed in a central portion and relatively small auxiliary gas holes 312 circularly arranged around the main gas hole 311. The upper end trapping unit 31 includes an upper surface, a lower surface, and a trapping plate installed between the upper surface and the lower surface by a fastening method such as fitting or welding and traps the reaction by-product contained in the gas.

Specifically, the upper end trapping unit 31 is provided in the form of a flat plate having a quadrangular shape and slightly smaller than an inner wall of an upper end of the housing main body to maximally block the internal space. Therefore, the gas, which is distributed from the heater 2 which is positioned at the upper side, toward the outer periphery of the internal space of the housing and moved downward, is not directly moved downward but guided to the main gas hole 311 formed in the central portion, such that the gas has a main flow. Further, some of the gas is guided to the plurality of relatively small auxiliary gas holes 312 circularly arranged in multiple rows around the main gas hole 311 and distributed to have an auxiliary flow, so that the trapping reaction is performed.

Double cross-shaped plates 313 are radially arranged on the upper surface of the upper end trapping unit 31 and protrude vertically while traversing the plurality of auxiliary gas holes 312 circularly arranged in multiple rows to generate vortices while guiding the gas flow, thereby enhancing the trapping efficiency. Quadrangular plates 314 are radially arranged on a lower surface of the upper end trapping unit 31 and vertically protrude downward while traversing the auxiliary gas holes 312, thereby performing the trapping reaction while guiding the uniform downward flow of the exhaust gas moving downward through the main gas hole 311 and the auxiliary gas holes 312.

In addition, the double cross-shaped plate 313 is formed such that two small quadrangular plates formed to cross the quadrangular plates which are length members radially arranged cross each other at a predetermined interval to simultaneously perform a role of uniformly and stably guiding the gas flow toward the main gas hole from the outer periphery and a role of increasing the trapping reaction time by generating the vortices.

In addition, the upper end trapping unit 31 is spaced apart from the intermediate trapping unit 32 at a predetermined height by spacers 315 and a support unit 316 having a necessary predetermined length installed on a lower portion of the upper end trapping unit 31. As one embodiment, the support unit 316 is provided in the form of a band-shaped plate having a predetermined width along an upper-end shape of the intermediate trapping unit 32 so that at least four spacers are fixed to have a plurality of holes, such that two opposite sides thereof are fixed by screw-coupling or welding.

The intermediate trapping unit 32 is configured to accommodate the gas introduced from the upper end trapping unit 31 to the central portion and uniformly trap the particulate reaction by-product contained in the gas in the inner region and the outer region while discharging the gas to the outside. Particularly, the inner region is formed in a reversed trapezoidal space structure to enhance the utilization of the trapping space between the upper and lower portions in the inner region.

To this end, the intermediate trapping unit 32 includes a plurality of planar cross-shaped vertical plates 321 coupled to a lower portion spaced apart from the upper end trapping unit at a predetermined interval and disposed to have gaps at predetermined intervals to form a quadrangular periphery.

The planar cross-shaped vertical plates 321 may have a cross-shaped flat cross-section by crossing two individual vertical plates 321a by a fitting or welding method.

At this time, the shape of the individual vertical plates 321a constituting the planar cross-shaped vertical plates 321 is formed so that the vertical plates positioned along the periphery direction have a flat plate shape. The vertical plate facing inwardly crossing the vertical plate is formed in a trapezoidal shape in which the area is widened from the upper side to the lower side, so that the upper space of the inner region provides a larger trapping space than the lower space.

In addition, the individual vertical plate 321a may have a structure in which an opposite individual vertical plate 321a and a lower surface facing each other are connected to a lower plate 321b to be integrally connected.

Since the planar cross-shaped vertical plates 321 formed as described above has a wider upper inner space than when the upper and lower spaces are the same as each other, the trapping first occurs in the upper region when the gas is introduced to continuously trap the gas during the former part of the use duration time by efficiently using the entire space from the lower part to the upper space without blocking.

In addition, in the planar cross-shaped vertical plates 321, the individual plates having a trapezoidal shape are formed only in a planar shape without gas holes and the like so that the gas may be moved without a load. Unlike the vertical trapping plate in which a plurality of gas holes having the same or different sizes are formed, as disclosed in the prior art, when formed only in the planar shape, there is an advantage in that the flow of the introduced gas rapidly flows downward without a load along the planar shape. In the vertical plate having such a flat trapezoidal structure, more trapping occurs due to the gas rapidly flowing toward the lower side. Since the upper portion is not blocked as the trapping reaction occurs at the beginning of the introduction, a continuous trapping reaction occurs through the entire vertical plates from the upper portion to the lower portion.

Meanwhile, the intermediate trapping unit 32 is provided with vortex plates 322 protruding outward along the lower side of the periphery formed by the planar cross-shaped vertical plates 321 constituting the intermediate trapping unit 32. The vortex plate 322 is configured to guide a reaction by-product in the form of a lump while increasing the trapping reaction time by generating a vortex by reducing the flow velocity of the gas flowing downward.

One vortex plate 322 may also be configured along the periphery of the intermediate trapping unit 32, and a plurality of vortex plates may be provided to be connected to each other. In one embodiment of the present disclosure, the vortex plate 322 is formed to have a quadrangular shape as a whole in four pieces according to the shape according to an embodiment of the intermediate trapping unit 32. Of course, such a shape does not limit the shape of the vortex plate of the present disclosure, and it is sufficient if the shape consists of various shapes and one or more.

The vortex plate 322 is formed with a gas slit 322a formed in the longitudinal direction on the outer surface side, and it is preferred that a plurality of gas slits is formed.

In addition, unlike the outer surface on which the gas slits 322a are formed, a gas opening 322b having a large opening area is formed toward the inner surface. As such, when one or more gas slits 322a are formed in the outer direction and gas openings 322b are formed in the inner direction, as the flow of gas flows more toward the gas opening 322b and less toward the gas slit 322a, the gas does not flow outward but flows inward the vortex plate 322, thereby increasing the utilization of the vortex plate 322.

In addition, due to such a structure, the reaction by-product generated and accumulated on the surface of the vortex plate 322 is highly likely to fall toward the gas opening 322b by being loaded into the gas flow, so that there is also an effect of better falling to the trapping cover 34 side located therebelow, thereby preventing the reaction by-product from being leaked.

In particular, the vortex plate 322 is installed to have an inclined shape so that an outer side thereof is high, so that the main flow of the gas flows downward through the outer region of the intermediate trapping unit 32 during the latter part of the use duration time of the trapping apparatus to meet the vortex plate 322 and generate vortices. The gas flow direction is also guided inward along the inclination angle and as the gas flows, the reaction time of the gas increases to induce the trapping of the reaction by-products in the form of a lump.

In addition, the vortex plate 322 having an inclined structure may prevent the trapped reaction by-products from being naturally accumulated on the inner side and being trapped in the gas and leaking to the outside.

In addition, the vortex plate 322 having an inclined structure induces the trapped reaction by-product to fall better toward the trapping cover 34 positioned therebelow to prevent the reaction by-product from being leaked.

The vortex plate 322 may be installed by forming grooves on the surface of the cross-shaped vertical plate 321 by fitting or welding.

The trapping cover 34 has a cylindrical structure in which a plurality of gas holes 341 is arranged on a surface, and is spaced apart from the lower portion of the intermediate trapping unit 32 at a predetermined interval to be installed in the vertical direction on the upper portion of the lower end trapping unit 33 along the periphery.

The trapping cover 34 has a cylindrical structure opened at upper and lower sides, in which the cylindrical shape may also have a quadrangular cylindrical body according to the shape of the intermediate trapping unit like one embodiment of the present disclosure, and have a cylinder having a shape according to various peripheries. In addition, the cylinder may consist of a single cylindrical body, or may be assembled by configuring each surface according to the periphery shape.

The shape of the gas hole 341 is configured as a hexagonal groove in one embodiment of the present disclosure, but the present disclosure is not limited to such a shape and may be configured as circular grooves, oval grooves, triangular grooves, slit grooves, or various polygonal grooves.

In addition, the trapping cover 34 is installed along a point spaced apart at a predetermined interval in order to secure a storage space by trapping sufficient reaction by-product, and needs to have a height to have a volume enough not to be leaked even while the trapped reaction by-product is sufficiently accumulated within the use duration time.

As one embodiment, when the height of the trapping cover is smaller than a middle height of the intermediate trapping unit 32, the trapping cover may have a volume enough not to be leaked even while the trapped reaction by-product is sufficiently accumulated within the use duration time without interfering with the flow of gas introduced to the intermediate trapping unit.

In addition, the spaced distance only needs to be spaced apart enough to be installed on the lower end trapping unit 33 located in the lower portion.

In one embodiment, in the present disclosure, the trapping cover 34 is formed to have substantially the same width as the lower end trapping unit. When the trapping cover 34 is spaced apart to have this width, even if the reaction by-product trapped in the upper end trapping unit 31, the intermediate trapping unit 32, and the wall surface plate 10a of the inner wall of the housing body, etc. falls while flowing over the gas, it is sufficient because it is highly likely to fall into the space inside the trapping cover as much as possible on the flow of the gas introduced into the lower end trapping unit 33.

However, such an installation example does not limit the installation shape or size of the trapping cover 34 of the present disclosure, and may be changed according to an amount of reaction by-product generated within the use duration time of the trapping apparatus.

The installed trapping cover 34 having the above structure traps the reaction by-product in the form of porous powder in the inner and outer regions of the planar cross-shaped vertical plates 321 and the vortex plate 322 of the intermediate trapping unit to prevent leak to the outside. In addition, it goes without saying that the trapping cover 34 may also trap the reaction by-product in the gas through the surface.

In addition, the trapping cover 34 also serves to naturally discharge the gas through the gas holes 341 formed on the surface. However, when the reaction by-product is accumulated in the inner space while being trapped in the trapping cover 34, while the gas flow is trapped in the trapping cover 34, the reactivity of the gas increases and the gas has a lump shape, so that the trapping cover having the gas holes 341 formed on the surface also serves as a barrier wall sufficiently. Accordingly, the reaction by-product is not easily leaked to the outside along the gas flow as if there is no trapping cover.

The reaction by-product accumulated on the trapping cover 34 is accumulated on the upper surface of the outer periphery trapping plate part 331 of the lower end trapping unit located in contact with the lower portion of the trapping cover 34 and a part thereof may be accumulated up to the upper surface of the lower inner trapping plate part 332 through the gas holes. At this time, the side surface of the outer periphery trapping plate part 331 has a closed structure in which an upper predetermined region is not formed with gas holes, and the upper surface of the lower inner trapping plate part 332 has a closed structure. Accordingly, a flow path structure is formed in which some gas flows along an unblocked space portion between the outer periphery trapping plate part 331 and the lower inner trapping plate part 332.

Meanwhile, the vortex plate 322 installed along the periphery of the intermediate trapping unit 32 may be positioned on the upper portion of the trapping cover 34 to cover the upper portion. At this time, it is preferable that the vortex plate 322 is shaped to protrude further than the trapping cover 34 to generate a vortex in the flow of the gas flowing downward. As such, when the vortex plate 322 is positioned on the upper portion of the trapping cover 34, the reaction by-product that has fallen to the lower portion of the vortex plate 322 may be trapped, and similarly, the reaction by-product accumulated on the trapping cover 34 may be prevented from being leaked to the outside through the upper opening.

In the intermediate trapping unit 32 and the trapping cover 34 configured as described above, the main flow of the gas during the former part of the use duration time has a tendency in which the gas is accommodated and flows to the lower portion of the inner region of the planar cross-shaped vertical plates 321 forming the periphery and then discharged in the outer region direction. Accordingly, the reaction by-product contained in the gas is trapped in the inner region of the planar cross-shaped vertical plates 321 to be evenly accumulated in the entire upper and lower portions of the inner region space portion having the reversed trapezoidal space structure and simultaneously accumulated in the interior of the trapping cover 34 and the upper region of the lower end trapping unit 33.

Thereafter, during the latter part of the use duration time, in which the reaction by-product is accumulated in the inner region space portion of the intermediate trapping unit 32 to reduce the trapping space, the introduced gas flows downward to be hardly discharged. Accordingly, the flow of the gas is guided to the outer region through a space between the plurality of planar cross-shaped vertical plates 321 installed at predetermined intervals to form a periphery so that the reaction by-product is trapped in the outer region of the planar cross-shaped vertical plates 321. That is, when the trapping amount of the reaction by-product increases, the gas flows to the outer region through the space from the upper side of the planar cross-shaped vertical plates 321 and then flows downward, so that the additional trapping reaction occurs in the outer region of the planar cross-shaped vertical plates 321.

At this time, some of the gas flowing downward is guided inward while generating the vortex by the vortex plate 322 installed to protrude outward along the lower side of the periphery formed by the planar cross-shaped vertical plates 321 to trap the reaction by-product in the form of a lump, and a part of the reaction by-product is accumulated continuously in the interior of the trapping cover 34 and the upper region of the lower end trapping unit 33.

Since the main flow is changed during the former part of the use duration time and the latter part of the use duration time as described above, during the former part of the use duration time, the reaction by-product is evenly accumulated on the entire upper and lower portions of the inner region space portion having the reversed trapezoidal space structure, and during the latter part of the use duration time, the reaction by-product flows downward to the lower portion of the outer region to have a more trapping amount.

In addition, during the latter part of the use duration time, the flow velocity of the gas flowing downward is reduced to generate a vortex by the trapping cover 34 installed along the periphery and the vertex plate 322 formed with the plurality of holes in the lower portion of the outer region of the planar cross-shaped vertical plates 321 forming a plurality of peripheries, so that the trapping reaction time is increased. Accordingly, the reaction by-product is trapped and accumulated to prevent the reaction by-product from falling down and being leaked to the gas discharge port.

The lower end trapping unit 33 is connected to the lower portion of the intermediate trapping unit 32 and includes an outer periphery trapping plate part 331 and an inner trapping plate part 332 which have a plurality of gas holes formed on surfaces thereof and are disposed in multiple stages. The lower end trapping unit 33 prevents the gas, which has been subjected to the trapping reaction in the inner region and the outer region of the intermediate trapping unit 32, from flowing downward directly into the gas discharge port 13$a$ provided on the lower plate of the housing. Therefore, the gas is guided toward the inner side from the outer periphery, such that the trapping reaction is finally performed. Further, the flow of the gas is guided so that the gas flows into the upper side of the gas discharge port 13$a$ protruding upward from the central portion of the lower plate of the housing and then flows downward.

In addition, the lower end trapping unit 33 is installed on the lower plate of the housing and installed in a state in which the lower end trapping unit 33 is spaced apart from the lower plate at a predetermined interval by the support member 333 fastened to the outer periphery trapping plate part 331 to support an overall load of the intermediate trapping unit 32 positioned at the upper side, thereby allowing the gas to smoothly flow in.

In the lower end trapping unit 33 including the outer periphery trapping plate part 331 and the inner trapping plate part 332, which are disposed in the multiple stages, the inner trapping plate part 332 is formed to be closer to the lower plate of the housing than the outer peripheral trapping plate part 331 so that the introduced gas sequentially flows in.

The lower end trapping unit 33 according to one embodiment will be described below in more detail.

The outer peripheral trapping plate part 331 has a quadrangular column structure (a cylindrical shape or a polygonal column shape may be applied) opened at a lower side thereof, and an upper trapping plate and each lateral trapping plate thereof may have a plurality of gas holes 331$a$.

In addition, the each lateral trapping plate includes a blocking part 331$b$ in which gas holes 331$a$ are not formed in a predetermined area of the upper portion to block the gas flow, thereby preventing the reaction by-product falling down through the upper trapping plate in the intermediate trapping unit from being laterally leaked.

The inner trapping plate part 333 has a quadrangular column structure (a cylindrical shape or a polygonal column shape may be applied) opened at a lower side thereof. The upper trapping plate has a blocked structure so as to be spaced apart from the upper trapping plate of the outer periphery trapping plate part 331 at a predetermined interval by the spacer 332$a$. The each lateral trapping plate has a plurality of gas holes 332$b$.

In the internal trapping tower 3 according to the present disclosure configured as described above, the main flow of the gas introduced into the housing is collected in the central portion of the upper end trapping unit 31 of the internal trapping tower 3 and sent to the intermediate trapping unit 32 disposed below the upper end trapping unit 31. In the intermediate trapping unit 32 having the inner region formed as the reversed trapezoidal space structure, the main flow of the gas flows quickly downward along the inner region of the planar cross-shaped vertical plates 321 forming the quadrangular periphery, and the gas has a main gas flow that produces the reaction by-product while performing the trapping reaction on the planar cross-shaped vertical plates 321 and then is discharged to the outer region through the interior of the trapping cover 34 and the upper region of the lower end trapping unit 33 positioned at the lower side.

Due to the gas flow during the former part of the use duration time, the reaction by-product is evenly accumulated in the entire upper and lower portions of the inner region space portion having the reversed trapezoidal space structure and simultaneously accumulated in the interior of the trapping cover 34 and the upper region of the lower end trapping unit 33.

In addition, the trapping cover 34 serves to continuously filter the outflow of the reaction by-product accumulated therein.

Thereafter, during the latter part of the use duration time when the trapping space is reduced by the reaction by-product trapped and accumulated in the inner region of the intermediate trapping unit 32 having the reversed trapezoidal space structure, the gas flow is guided to the outer region from the upper side of the planar cross-shaped vertical plates, such that the gas flows downward, and the reaction by-product is additionally trapped.

In addition, some of the gas flowing downward is guided inward while generating the vortex by the vortex plate 322 installed to protrude outward along the lower side of the periphery formed by the planar cross-shaped vertical plates 321 to trap the reaction by-product in the form of a lump, and a part of the reaction by-product is accumulated continuously in the interior of the trapping cover 34 and the upper region of the lower end trapping unit 33.

During the latter part of the use duration time, the trapping cover 34 also serves to continuously filter the outflow of the reaction by-product accumulated therein.

In addition, during the use duration time, the gas flowing downward through the outer side of the intermediate trapping unit 32 is introduced to the upper side of the gas discharge port 13$a$ protruding upward from the central portion of the housing lower plate, flows downward, and then is discharged, after finally trapping the reaction by-product contained in the gas while preventing a leak of the reaction by-product through the outer periphery trapping plate part 331 and the inner trapping plate part 332 of the lower end trapping unit 33 from the lower portion.

Figure 10:
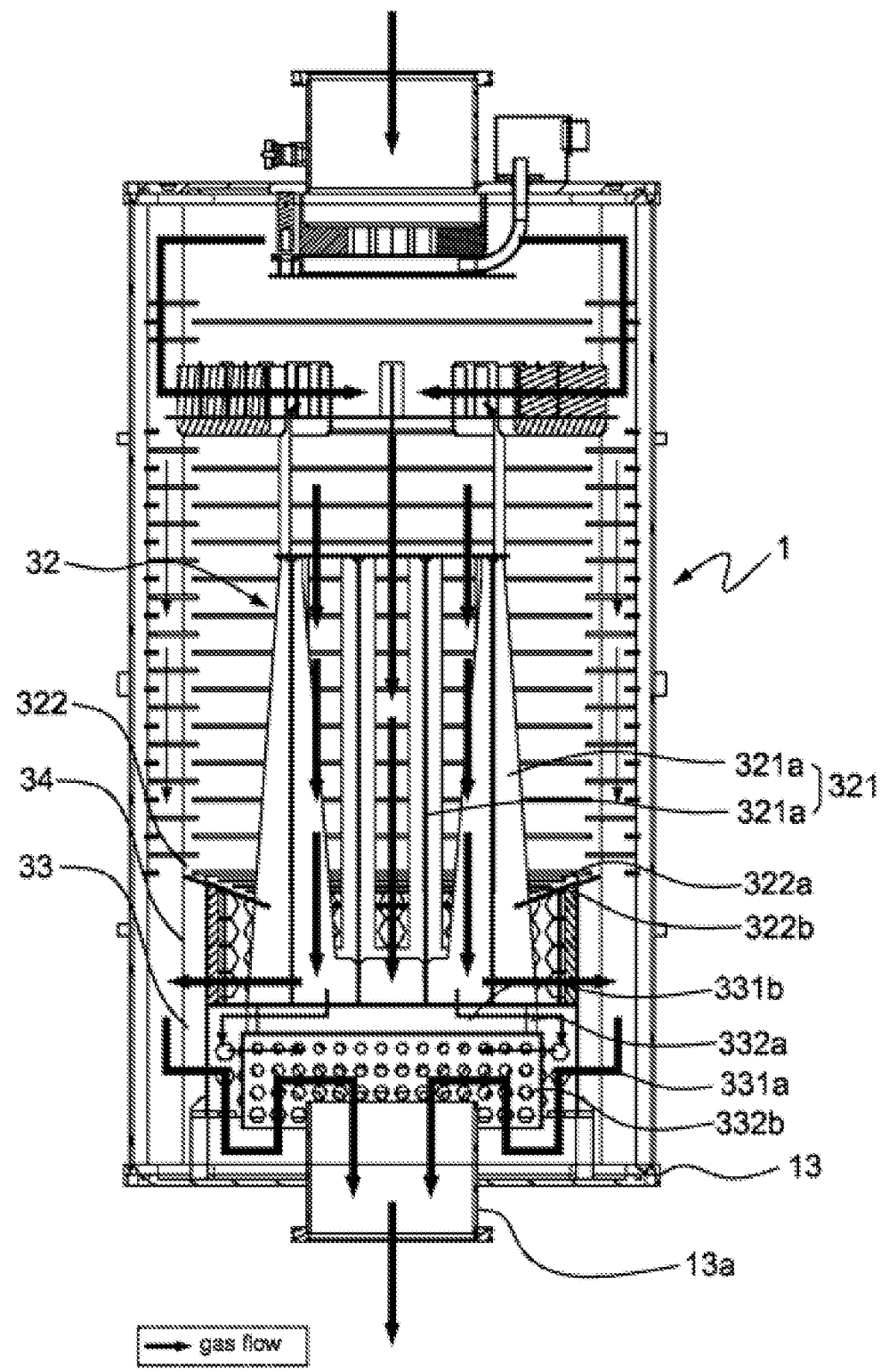
FIG. 10 is an exemplified view illustrating a gas flow in the apparatus for trapping of a reaction by-product according to the embodiment of the present disclosure during a former part of a use duration time.
Figure 11:
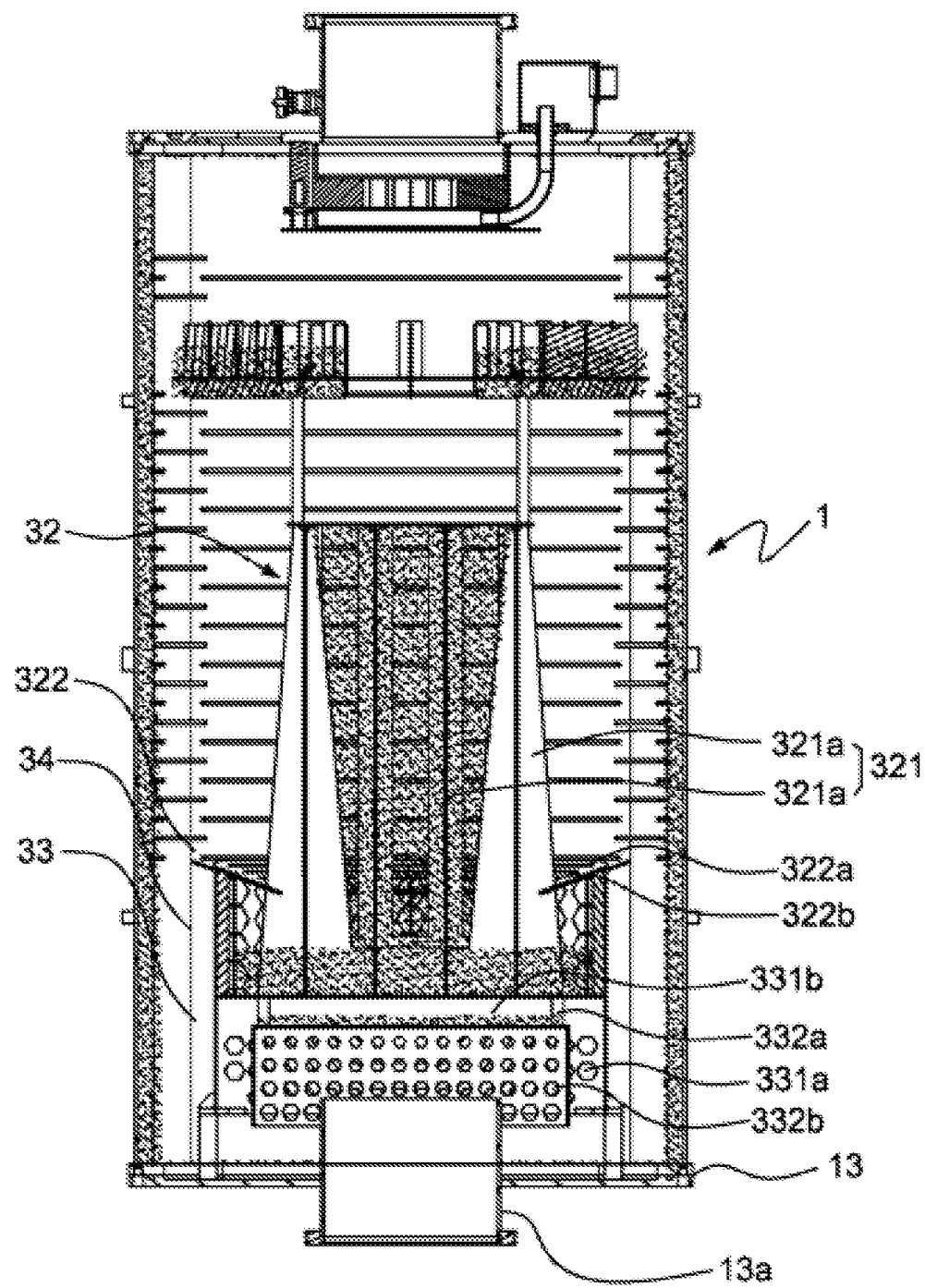
FIG. 11 is an exemplified view illustrating a trapping tendency in the apparatus for trapping of a reaction by-product according to the embodiment of the present disclosure during the former part of the use duration time.

FIG. 10 is an exemplified view illustrating a gas flow in the apparatus for trapping of a reaction by-product according to the embodiment of the present disclosure during a former part of a use duration time and FIG. 11 is an exemplified view illustrating a trapping tendency in the apparatus for trapping of a reaction by-product according to the embodiment of the present disclosure during the former part of the use duration time. Hereinafter, reference numerals illustrated in the drawings are described in the above-mentioned description.

As illustrated in the drawings, the gas flow and the reaction by-product trapping tendency during the former part of the use duration time will be described below.

The gas, which is introduced through the gas inlet port 12a provided on the upper plate 12 constituting the housing 1, is heated by the heater 2 and distributed radially to the outer periphery of the housing main body 11 by the diffusers 2a positioned at the upper side, and then the gas flows downward.

Thereafter, while the main flow of the gas is guided to the main gas hole 311 of the central portion from the outer periphery by the upper end trapping unit 31 of the internal trapping tower 3 and moves downward, the trapping reaction occurs on the upper surface, the lower surface, and the double cross-shaped plate 313 and the quadrangular plates 314 installed on the upper surface.

The main flow of the gas flowing downward to the main gas hole 311 flows downward into the inner region having the reversed trapezoidal space structure in the intermediate trapping unit 32 and then is discharged to the outer region installed with the trapping cover 34.

In this case, the planar cross-shaped vertical plates 321 coagulate and trap the reaction by-product in the gas, such that the reaction by-product is continuously accumulated in the inner region, the interior of the trapping cover 34, and the upper region of the lower end trapping unit 33.

In particular, since respective vertical plates constituting the planar cross-shaped vertical plates 321 have a trapezoidal structure, the reaction by-product is accumulated in the entire space during the trapping reaction without the clogging of the upper portion of the inner region.

Thereafter, the gas discharged to the outer region through the trapping cover 34 at the lower portion passes through the lower end trapping unit 33 having the multiple stages, and flows into the upper side of the gas discharge port 13a protruding upward from the central portion of the lower plate of the housing positioned inside the lower end trapping unit 33. Thereafter, the gas flows downward and is discharged.

Figure 12:
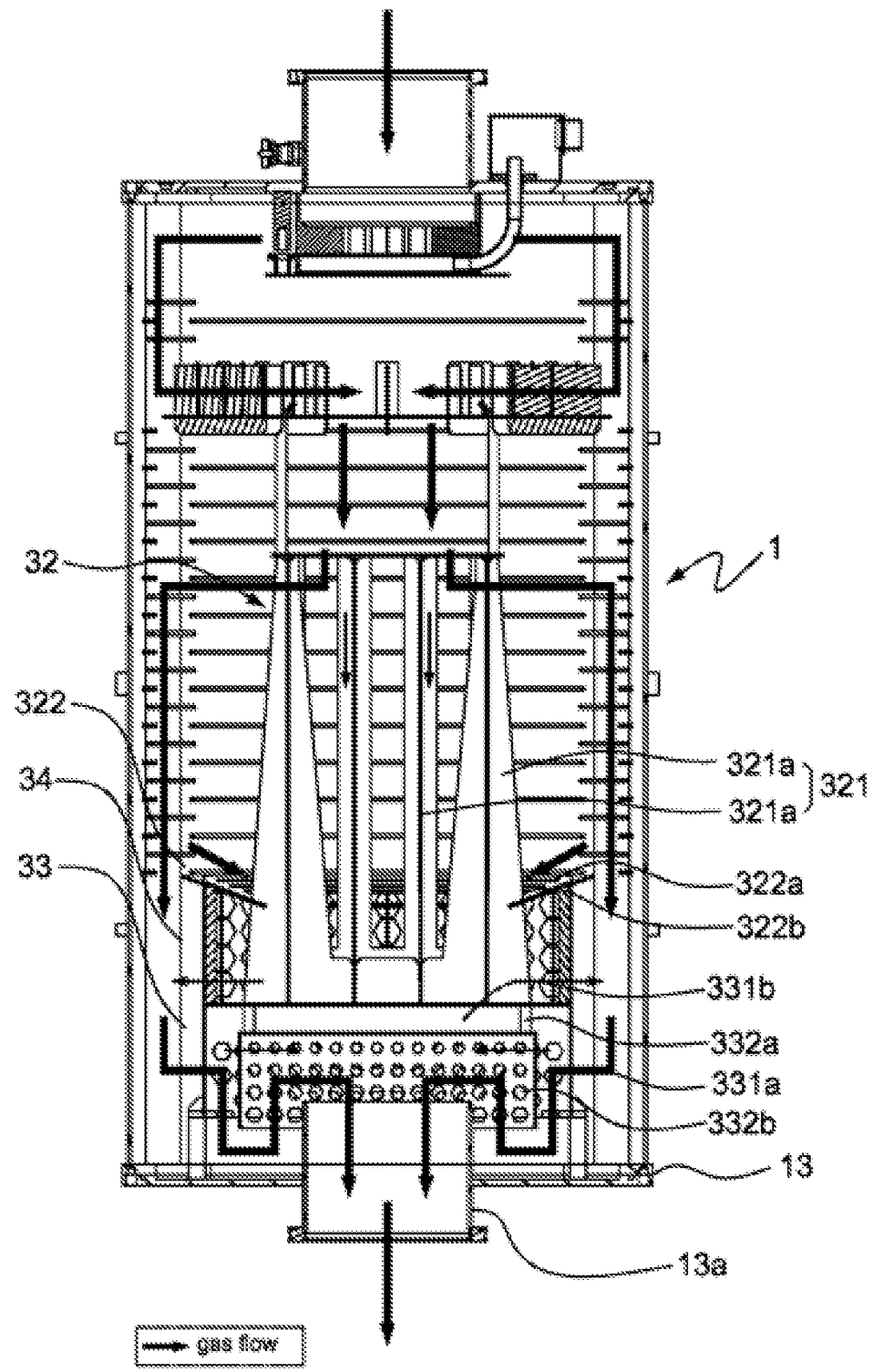
FIG. 12 is an exemplified view illustrating a gas flow in the apparatus for trapping of a reaction by-product according to the embodiment of the present disclosure during a latter part of the use duration time.
Figure 13:
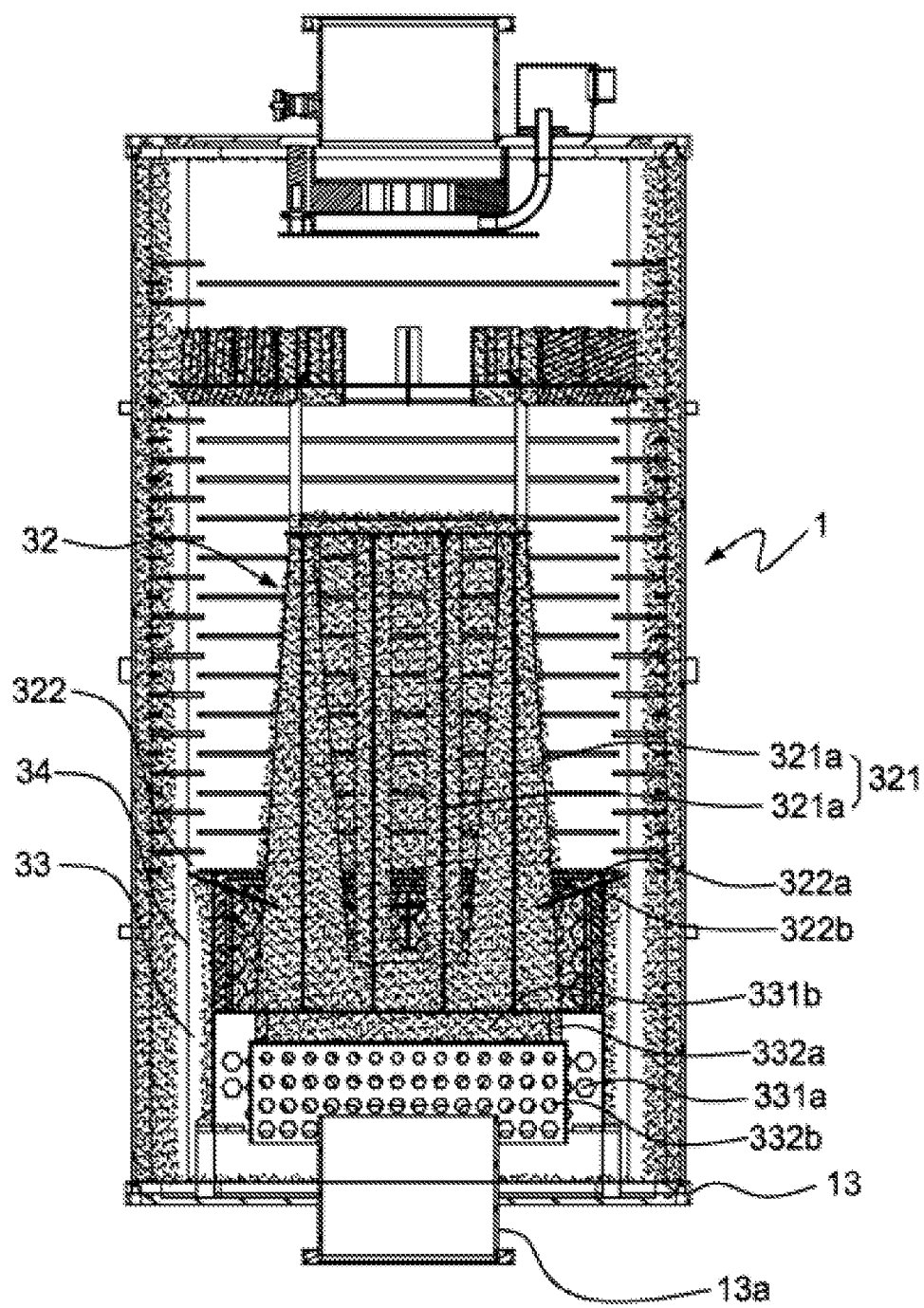
FIG. 13 is an exemplified view illustrating a trapping tendency in the apparatus for trapping of a reaction by-product according to the embodiment of the present disclosure during the latter part of the use duration time.

FIG. 12 is an exemplified view illustrating a gas flow in the apparatus for trapping of a reaction by-product according to the embodiment of the present disclosure during a latter part of the use duration time and FIG. 13 is an exemplified view illustrating a trapping tendency in the apparatus for trapping of a reaction by-product according to the embodiment of the present disclosure during the latter part of the use duration time.

As illustrated in the drawings, the gas flow and the reaction by-product trapping tendency during the latter part of the use duration time will be described below.

The gas, which is introduced through the gas inlet port 12a provided on the upper plate 12 constituting the housing 1, is heated by the heater 2 and distributed radially to the outer periphery of the housing main body 11 by the diffusers 2a positioned at the upper side, and then the gas flows downward.

Thereafter, while the main flow of the gas is guided to the main gas hole 311 of the central portion from the outer periphery by the upper end trapping unit 31 of the internal trapping tower 3 and moves downward, the trapping reaction occurs on the upper surface, the lower surface, and the double cross-shaped plate 313 and the quadrangular plates 314 installed on the upper surface.

The main flow of the gas flowing downward to the main gas hole 311 cannot flow downward any further because the trapping space is reduced by the inner reaction by-product trapped and accumulated in the inner region of the planar cross-shaped vertical plates. Therefore, the gas flow is guided to the outer region from the upper side of the planar cross-shaped vertical plates, and the gas flows downward, such that the reaction by-product is additionally trapped in the outer region of the planar cross-shaped vertical plates which has not yet been frequently used in the trapping reaction.

In particular, since the respective vertical plates constituting the planar cross-shaped vertical plates 321 have a trapezoidal structure, the trapping reaction actively occurs at the lower side of the outer region during the latter part of the use duration time in the trapping reaction, such that the reaction by-product is continuously accumulated on the interior of the trapping cover 34 and the upper region of the lower end trapping unit 33.

In addition, by the vortex plates 324 installed along the periphery of the lower side of the outer region of the planar cross-shaped vertical plates 321, which are installed at the upper portion of the trapping cover 34, a flow velocity of the gas flowing downward is reduced, the vortex is generated, and the trapping reaction time is increased. Further, the vortex plates prevent the trapped and accumulated reaction by-product from being dropped and leaking to the gas discharge port.

Thereafter, the gas passes through the lower end trapping unit 33 and flows into the upper side of the gas discharge port 13a protruding upward from the central portion of the lower plate of the housing positioned inside the lower end trapping unit 33. Thereafter, the gas flows downward and is discharged.

The present disclosure is not limited to the specific exemplary embodiment described above, various modifications can be made by any person skilled in the art to which the present disclosure pertains without departing from the subject matter of the present disclosure as claimed in the claims, and the modifications are within the scope defined by the claims.

What is claimed is:

1. An apparatus for trapping of a reaction by-product with an extended available collection area, which is configured to accommodate gas, which is discharged after a deposition process during a semiconductor manufacturing process, in a housing (1), heat the gas with a heater (2), trap a reaction by-product contained in the gas by using an internal trapping tower (3), and discharge only the gas, wherein the internal trapping tower (3) is configured to trap, in multiple stages, the reaction by-product according to a height, the internal trapping tower (3) including separately: an upper end trapping unit (31) configured to perform a trapping reaction while guiding and lowering a main flow of the gas to a central portion; an intermediate trapping unit (32) in which an inner region is formed as a reversed trapezoidal space portion so as to accommodate the introduced gas and trap the reaction by-product; a lower end trapping unit (33) configured to prevent a leak of the trapped reaction by-product to a gas discharge port (13a) of the housing while trapping, in multiple stages, the reaction by-product from the gas introduced through a lateral side; and a trapping cover (34) configured to prevent an external leak by trapping the reaction by-product in a porous powder form trapped in the inner and outer regions of the intermediate trapping unit, wherein the intermediate trapping unit (32) is configured such that depending on a change in trapping amount according to an elapse of a use duration time, a main flow of the gas is guided so that the gas flows toward an outer region after flowing downward to an inner region of planar cross-shaped vertical plates (321) forming a periphery during a former part of the use duration time, and the gas is guided to flow downward after flowing to the outer region of the planar cross-shaped vertical plates (321) from an upper side of the inner region during a latter part of the use duration time when the trapped reaction by-product is accumulated in the inner region, such that an additional trapping reaction is performed, and wherein the trapping cover (34) has a cylindrical structure in which a plurality of gas holes (341) is arranged on a surface, and is spaced apart from the lower portion of the intermediate trapping unit (32) at a predetermined interval to be installed in a vertical direction on the lower end trapping unit (33) along the periphery.

2. The apparatus for trapping of a reaction by-product with an extended available collection area of claim 1, wherein the upper end trapping unit (31) is configured to guide the gas, which is distributed in a direction from the heater toward an outer periphery in the housing and flows downward, to the intermediate trapping unit (32) spaced apart from the lower portion at a predetermined interval through a main gas hole (311) formed in a central portion and relatively small auxiliary gas holes (312) circularly arranged around the main gas hole (311) and trap the reaction by-product contained in the gas on an upper surface installed with double cross-shaped plates (313) and a lower surface installed with quadrangular plates (314).

3. The apparatus for trapping of a reaction by-product with an extended available collection area of claim 1, wherein the intermediate trapping unit (32) includes a plurality of planar cross-shaped vertical plates (321) coupled to a lower portion spaced apart from the upper end trapping unit (31) at a predetermined interval and disposed to have gaps at predetermined intervals and defining a periphery, and an individual vertical plate (321a) constituting the planar cross-shaped vertical plates (321) is formed in a trapezoidal shape in which an area of the vertical plate facing inward is increased from the top to the bottom and configured to provide a trapping space in which an upper space in the inner region is larger than a lower space in the inner region of the intermediate trapping unit (32).

4. The apparatus for trapping of a reaction by-product with an extended available collection area of claim 1, further comprising:

vortex plates (322) installed along the periphery of the intermediate trapping unit (32), and formed with one or more gas slits (322a) formed outside in a longitudinal direction and gas openings (322b) formed inside.

5. The apparatus for trapping of a reaction by-product with an extended available collection area of claim 4, wherein the vortex plate (322) is inclined so that an outer side thereof is high.

6. The apparatus for trapping of a reaction by-product with an extended available collection area of claim 1, wherein the trapping cover (34) is installed so that the vortex plate (322) having an inclined shape covers the upper portion.

7. The apparatus for trapping of a reaction by-product with an extended available collection area of claim 1, wherein the lower end trapping unit (33) is connected to the lower portion of the intermediate trapping unit (32) and includes an outer periphery trapping plate part (331) and an inner trapping plate part (332) which have a plurality of gas holes formed on surfaces thereof and are disposed in multiple stages, wherein the lower end trapping unit (33) prevents the gas, which is subjected to the trapping reaction in the inner region and the outer region of the intermediate trapping unit (32), from flowing downward directly into the gas discharge port (13a) provided on a lower plate of the housing and the gas is guided toward an inner side from the outer periphery, such that the trapping reaction is finally performed, and then the gas flows into the upper side of the gas discharge port (13a) protruding upward from the central portion of the lower plate of the housing and then flows downward.

8. The apparatus for trapping of a reaction by-product with an extended available collection area of claim 7, wherein the outer peripheral trapping plate part (331) has a structure opened at a lower side thereof and includes an upper trapping plate and lateral trapping plates each having a plurality of gas holes (331a), wherein each lateral trapping plate consists of a blocking part (331b) in which gas holes (331a) are not formed in an upper predetermined region to block the flow of the gas, thereby preventing the reaction by-product, which has fallen through the upper trapping plates from the intermediate trapping unit, from being leaked in a lateral direction.

9. The apparatus for trapping of a reaction by-product with an extended available collection area of claim 7, wherein the inner trapping plate part (332) has a structure opened at a lower side thereof, wherein the upper trapping plate is formed in a blocked structure and installed to be spaced apart from the upper trapping plate of the outer periphery trapping plate part (331) at a predetermined interval by spacers (332a), and each lateral trapping plate is formed with a plurality of gas holes (332b).

* * * * *